United States Patent [19]

Kuech et al.

[11] Patent Number: 4,504,331
[45] Date of Patent: Mar. 12, 1985

[54] SILICON DOPANT SOURCE IN INTERMETALLIC SEMICONDUCTOR GROWTH OPERATIONS

[75] Inventors: Thomas F. Kuech, Ossining; Bernard S. Meyerson, Yorktown Heights, both of N.Y.

[73] Assignee: International Business Machines Corporation, Armonk, N.Y.

[21] Appl. No.: 559,583

[22] Filed: Dec. 8, 1983

[51] Int. Cl.³ .................. H01L 21/205; H01L 21/322
[52] U.S. Cl. .................... 148/175; 29/576 E; 148/174; 156/605; 156/606; 156/610; 156/613; 156/614; 156/DIG. 70; 156/DIG. 104; 252/951; 427/85; 427/87
[58] Field of Search ............. 148/174, 175; 29/576 E; 156/605, 606, 610, 613, 614, DIG. 70, DIG. 104; 427/85, 87; 252/950, 951

[56] References Cited

U.S. PATENT DOCUMENTS

| | | | |
|---|---|---|---|
| 3,492,175 | 1/1970 | Conrad et al. | 148/175 |
| 4,128,733 | 12/1978 | Fraas et al. | 148/174 X |
| 4,147,571 | 4/1979 | Stringfellow et al. | 148/175 |
| 4,220,488 | 9/1980 | Duchemin et al. | 148/175 |
| 4,329,189 | 5/1982 | Noad et al. | 148/175 X |

OTHER PUBLICATIONS

Bass, S. J., "Silicon and Germanium Doping ... Gallium Arsenide ... " J. Crystal Growth, v. 47, 1979, pp. 613–618.

"A New Method for Growing GaAs Epilayers by Low Pressure Organometallics" by Duchemin et al., J. of the Electrochemical Soc., vol. 126, No. 7, Jul. 1979, pp. 1134–1142.

"Si Doped GaAs Using a SiCl₄ Techique in a AsCl₃/Ga/H₂ CVD System for MESFET" by Feng et al., Inst. Phys. Conf., Ser. No. 56: Chapter 1, pp. 1–8.

"Preparation of Amorphous Silicon Films by Chemical Vapor Deposition from Higher Silanes $Si_nH_{2n+2}(n>1)$" by Gau et al., Appl. Phys. Lett. 39 (5), Sep. 1, 1981, pp. 436–438.

Primary Examiner—William G. Saba
Attorney, Agent, or Firm—Alvin J. Riddles

[57] ABSTRACT

In intermetallic semiconductor crystal growth such as the growth of GaAs and GaAlAs, silicon as a dopant can be introduced more efficiently and evenly when provided as a gaseous hydride based compound involving a molecule where there are joined silicon atoms such as $Si_2H_6$ to $Si_5H_{12}$.

7 Claims, 1 Drawing Figure

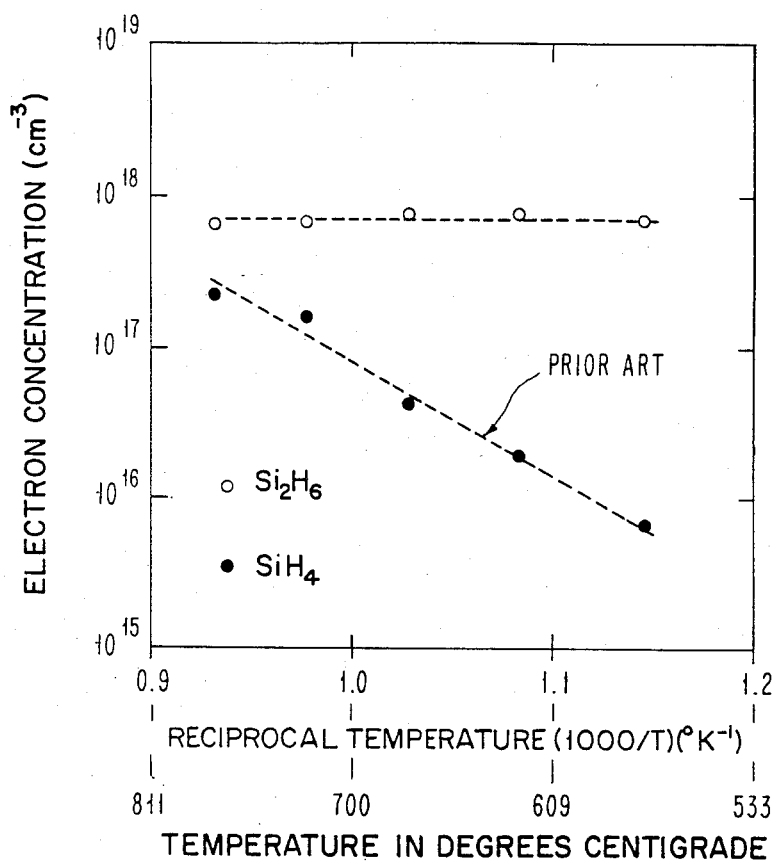

SILICON DOPANT SOURCE IN INTERMETALLIC SEMICONDUCTOR GROWTH OPERATIONS

DESCRIPTION

1. Technical Field

The technical field of the invention is in the growth of semiconductor device crystals by the addition of atoms and molecules in epitaxial periodicity to a crystalline substrate. One of the most popular forms of such growth at this point in the art is Metal Organic Chemical Vapor Deposition (MOCVD).

2. Background Art

In the growth of intermetallic semiconductors of which the most popular are the Group III-Group V binary compounds such as gallium arsenide (GaAs), the ternary variations such as gallium aluminum arsenide (GaAlAs) and the quaternary variations such as gallium indium arsenide phosphide (GaInAsP), the element silicon (Si) has been found to be desirable for incorporation as a dopant.

There are, however, in this type of growth wherein the crystalline material is grown atom by atom epitaxially, several requirements for the silicon source in order that the dopant enter the crystal in such a way that device specifications can be met. The dopant must be present over the growing crystal in a concentration or flux that is uniform over the area and remains so for the duration of the growth period, in order to result in a crystal with a controlled doping concentration. The source of silicon must be pure since small quantities of impurities can affect device performance. The silicon source should also be capable of rapid changes in concentration over the surface of the growing crystal in order to reach both the concentrations and the rates of change of concentrations required to impart performance to device structures.

In the intermetallic semiconductors such as III-V and related type compounds there are disadvantages with many of the elements that would be considered to be an n-type dopant. The elements of Group VI of the periodic table sulfur (S), selenium (Se) and tellurium (Te) are so volatile so that their use introduces problems in the ambient in which the growth takes place and the volatility also interferes with the ability to grow lightly doped materials controllably. The Group IV elements of which silicon is a member also serve as n-type dopants. However, such elements are often amphoteric and care must be used in control. The Group IV element germanium (Ge) exhibits extreme amphotericity. The element tin (Sn) is both amphoteric and has the additional problem of surface segregation. Of the Group IV elements the element silicon (Si) is the most promising. Silicon however is exceptionally non-volatile. The low volatility of elemental silicon preempts its direct use in vapor phase growth. This is generally overcome by providing the silicon in the hydride silane ($SiH_4$). A description of the introduction of silicon as a dopant using silane ($SiH_4$) is given in J. Electro-chemical Society 126, No. 7, July 1979, p. 1134.

BRIEF DESCRIPTION OF THE DRAWING

The drawing is a graph comparing the variation of electron concentration with growth temperature for $SiH_4$ and $Si_2H_6$ doping in MOCVD for equal concentrations of dopant gas in the growth ambient.

DISCLOSURE OF THE INVENTION

It has been found that disilane ($Si_2H_6$) and the higher hydride based silicon compounds when maintained in the gaseous state over a growing intermetallic semiconductor substrate, will serve as a source of silicon dopant in the growing crystal that provides a higher doping efficiency and a more uniform doping distribution yet achieved at a lower temperature.

The higher silane compounds that are gaseous at lower temperatures, up to $Si_3H_8$, and the even higher silane compounds, up through $Si_5H_{12}$, that can be maintained in the vapor state over the growing crystal are satisfactory dopant sources, with disilane ($Si_2H_6$) being preferred. The growth of the intermetallic crystal can occur at temperatures greater than 500° C. and with the dopant source of the invention there is no variation in doping efficiency with temperature variation.

While precise theory has not as yet been verified, the following hypothesis of events is set forth to facilitate practicing the invention. The decomposition of the higher hydride based compounds of silicon takes less energy than the removal of hydrogen atoms from a single silicon atom such as the case in the decompostion of silane ($SiH_4$) and in turn the lower required energy permits efficient doping at lower temperatures, and less temperature sensitivity for uniform growth and doping.

Referring to the drawing, a graph is provided illustrating the influence of growth temperature on electron concentration in gallium arsenide (GaAs). This is used to measure dopant concentration for both an example of the invention, disilane, ($Si_2H_6$) and the prior art silane ($SiH_4$) under growth conditions of a constant amount of dopant and at a constant growth rate. In the graph, the temperature scale is in both degrees centigrade and reciprocal temperature. From the concentrations shown not only does more silicon enter the growing crystal when disilane is used thereby illustrating enhanced doping efficiency but also disilane doping is seen to be temperature independent. The silicon dopant source of the invention permits control not achieved heretofore in the art. The silicon doped GaAs crystal layers produced are characterized by room and low temperature photoluminescence, capacitance profiling and Van der pauw Hall measurements.

In a typical MOCVD system the substrates on which the intermetallic semiconductor crystals are to be grown are positioned on a hot susceptor and are then brought to an elevated temperature of the order of 550° C. to 800° C. while exposed to the gaseous slicon source. In such a system it is common for the temperature across the area of the substrates to vary of the order of $\pm 10°$ C. Referring to the drawing using a silane $SiH_4$ source of the prior art, a $\pm 10°$ C. variation in substrate temperature at 650° C. would result in a $\pm 20\%$ variation in silicon dopant incorporation across a substrate so that the doping would not be homogenous. In contrast, where the silicon source of the invention such as disilane ($Si_2H_6$) is employed, the incorporation as shown in the drawing is independent of temperature and a $\pm 10\%$ temperature variation would have no effect on the doping concentration. The silicon source of the invention provides uniform doping even though temperature gradients may occur.

The same improved doping characteristics of disilane ($Si_2H_6$) also occur in the ternary gallium aluminum arsenide ($Ga_{1-x}Al_xAs$) where for example at a ternary composition of $x=0.3$ grown at 750° C., for the same concentration of dopant gas in the growth ambient, disilane (Si$_2$H$_6$) exhibits a fifty-fold increase in doping efficiency over silane (SiH$_4$) independent of temperature.

Referring again to the drawing, it is shown that the doping efficiency is greater which permits higher conductivity device material to be made thereby providing intermetallic semiconductor material capable of meeting a wider range of device specifications. Further, one of the difficulties with gaseous sources is that there may be some uncontrollable impurities in the gas and these are carried into the growth chamber. Where the doping efficiency is high as with this invention, the quantity of gas needed is less and thus the contamination from impurities in the gas is reduced.

BEST MODE FOR CARRYING OUT THE INVENTION

The growth of silicon doped gallium arsenide (GaAs) by metal organic chemical vapor deposition is accomplished by the addition of a small amount of disilane (Si$_2$H$_6$) to the gas phase ambient during the gallium arsenide growth. The disilane (Si$_2$H$_6$) is markedly less stable than silane (SiH$_4$), its decomposition by-products do not contaminate the gallium arsenide (GaAs) layers and the silicon enters the growing crystal so efficiently that the amount of dopant gas required at lower growth temperatures is reduced by two orders of magnitude.

What has been described is the use of disilane or higher hydride based silicon compounds as a more efficient and uniform dopant source of silicon in intermetallic semiconductor crystal growth.

Having thus described our invention, what we claim as new and desire to secure by Letters Patent is:

1. In the metal organic chemical vapor deposition growth of an intermetallic semiconductor crystal wherein silicon is introduced as a dopant during said growth the improvement comprising providing said silicon dopant from a source of a hydride based compound of silicon involving a molecule where there are joined silicon atoms in gaseous form over said growing crystal.

2. The improvement of claim 1 wherein said hydride based silicon compound is a higher silane gas.

3. The improvement of claim 2 wherein said higher silane gas is disilane Si$_2$H$_6$.

4. The improvement of claim 2 wherein said hydride based silicon compound is a higher silane between Si$_2$H$_6$ and Si$_5$H$_{12}$.

5. The improvement of claim 1 wherein said intermetallic semiconductor is gallium arsenide (GaAs).

6. The improvement of claim 1 wherein said intermetallic semiconductor is gallium aluminum arsenide (GaAlAs).

7. The improvement of claim 3 wherein said intermetallic semiconductor is a member of the group of gallium arsenide (GaAs) and gallium aluminum arsenide (GaAlAs).

* * * * *